US 9,577,375 B2

(12) United States Patent
Goodman (10) Patent No.: US 9,577,375 B2
(45) Date of Patent: Feb. 21, 2017

(54) CONNECTOR ALIGNMENT ASSEMBLY (71) Applicant: Advanced Interconnections Corp., West Warwick, RI (US)

(72) Inventor: Glenn Goodman, Harrisville, RI (US)

(73) Assignee: Advanced Interconnections Corp., West Warwick, RI (US)

( * ) Notice: Subject to any disclaimer, the term of this patent is extended or adjusted under 35 U.S.C. 154(b) by 0 days.

(21) Appl. No.: 14/832,093

(22) Filed: Aug. 21, 2015

(65) Prior Publication Data

US 2016/0064839 A1 Mar. 3, 2016

Related U.S. Application Data

(60) Provisional application No. 62/043,557, filed on Aug. 29, 2014.

(51) Int. Cl.
*H01R 12/00* (2006.01)
*H01R 13/629* (2006.01)
*H01R 12/91* (2011.01)
*H05K 7/10* (2006.01)

(52) U.S. Cl.
CPC ............ *H01R 13/629* (2013.01); *H01R 12/91* (2013.01); *H05K 7/10* (2013.01)

(58) Field of Classification Search
CPC ......... H01R 12/52; H01R 9/096; H01R 12/72; H01R 4/48; H01R 13/4538; H01R 13/453; H01R 12/526
USPC ................ 439/62, 65, 66, 861, 81, 140, 141
See application file for complete search history.

(56) References Cited

U.S. PATENT DOCUMENTS

| | | | | |
|---|---|---|---|---|
| 7,463,041 B2* | 12/2008 | Kazama | ............ | G01R 1/07314 324/755.05 |
| 7,973,551 B2* | 7/2011 | Jiang | .................. | G01R 31/2808 324/763.01 |
| 8,814,601 B1* | 8/2014 | Sherrer | .................... | H01R 4/34 29/852 |
| 2004/0029412 A1* | 2/2004 | Hachuda | ............ | G01R 1/06722 439/66 |
| 2005/0164527 A1* | 7/2005 | Radza | ..................... | H01L 24/72 439/66 |
| 2006/0035483 A1* | 2/2006 | Rathburn | ............... | H01R 12/57 439/65 |
| 2006/0089016 A1* | 4/2006 | Xie | ...................... | H05K 7/1061 439/71 |

(Continued)

*Primary Examiner* — Abdullah Riyami
*Assistant Examiner* — Thang Nguyen
(74) *Attorney, Agent, or Firm* — Occhiuti & Rohlicek LLP (57) ABSTRACT

A connector alignment assembly comprises a support member having a surface from which an array of male connector pins extend outwardly, each male connector pin having a base region proximate the surface of the support member and a tip region proximate the end of each male connector pin. Guide posts extend from the surface in the direction of the array of male connector pins and compression mechanisms, one associated with each of the guide posts. The compression mechanisms are adapted to transition from the uncompressed position to a compressed position. An alignment plate has guide holes which engage with the guide posts to position the alignment plate in a spaced relationship from the surface of the support member. The alignment plate has an array of male connector pin holes which engage with the array of male connector pins.

20 Claims, 5 Drawing Sheets

(56) References Cited

U.S. PATENT DOCUMENTS

| | | | |
|---|---|---|---|
| 2006/0121750 A1* | 6/2006 | Beurskens | G01R 1/0466 439/66 |
| 2007/0167038 A1* | 7/2007 | Goodman | H01R 23/27 439/70 |
| 2008/0311769 A1* | 12/2008 | Yamada | G01R 1/0466 439/68 |
| 2009/0023311 A1* | 1/2009 | Goodman | H05K 7/1061 439/66 |
| 2009/0035997 A1* | 2/2009 | Correll | H01R 9/2675 439/709 |
| 2009/0186495 A1* | 7/2009 | Taylor | H01R 12/714 439/66 |
| 2011/0008992 A1* | 1/2011 | Alguera Gallego | B60D 1/64 439/378 |
| 2011/0223778 A1* | 9/2011 | Chow | H01L 21/4853 439/66 |
| 2012/0003845 A1* | 1/2012 | Goodman | H01R 13/2407 439/65 |
| 2012/0208381 A1* | 8/2012 | Garcia | H01R 13/2421 439/64 |
| 2014/0206206 A1* | 7/2014 | Cohen | H01R 12/714 439/66 |

* cited by examiner

CONNECTOR ALIGNMENT ASSEMBLY

CROSS REFERENCE TO RELATED APPLICATION

This application claims priority to U.S. Provisional Application No. 62/043,557, filed on Aug. 29, 2014, the contents of which are hereby incorporated by reference in its entirety.

FIELD OF INVENTION

The present invention relates to electrical connector assemblies for interconnecting integrated circuits.

BACKGROUND

Electrical connection pins are a popular means for connecting two electrical devices. For example, integrated circuit (IC) packages typically possess a number of male electrical connection pins for mounting the IC package to an electrical socket on a printed circuit board (PCB). Each of the male electrical connection pins of the IC package is inserted into corresponding female socket terminals in the electrical socket on the PCB.

As technology continues to advance, the size of electrical devices continues to decrease while the number of connections required between electrical devices continues to increase. Consequently, increasing the density of electrical connection terminals for electrically connecting two electrical devices is necessary. Since the male connection pins are relatively tall and thin, they are fragile and more susceptible to damage such as being bent or broken during handling, transport and mating.

SUMMARY

In a general aspect of the invention, a connector alignment assembly, comprises a support member having a surface from which an array of male connector pins extend outwardly. Each male connector pin has a base region proximate the surface of the support member and a tip region proximate the end of each male connector pin. There are a plurality of guide posts extending from the surface in the direction of the array of male connector pins and a plurality of compression mechanisms, one associated with each of said plurality of guide posts. Each of the plurality of compression mechanisms is adapted to transition from the uncompressed position to a compressed position. There is an alignment plate having a plurality of guide holes which engage with the plurality of guide posts and the associated compression mechanisms to position the alignment plate in a spaced relationship from the surface of the support member. The alignment plate further has an array of male connector pin holes each of which engages with a corresponding male connector pin from the array of male connector pins. When the compression mechanisms are in the uncompressed position, each male connector pin hole of the array of male connector pin holes in the alignment plate engages with the tip region of a corresponding male connector pin of the array of male connector pins thereby protecting the male connector pins from damage.

Embodiments of this aspect of the invention may include one or more of the following features. When the compression mechanisms are in the compressed position, each male connector pin hole of the array of male connector pin holes in the alignment plate engages with the base region of its corresponding male connector pin of the array of male connector pins. There are four guide posts positioned about the perimeter of the support member and the compression mechanisms are springs, each disposed about a guide post. The support member further includes an array of sockets disposed on the surface. The array of male connector pins is arranged in a plurality of rows on the surface of the support member.

The array of male connector pins is arranged in a plurality of rows on the surface of the support member and the array of sockets is arranged in said plurality of rows with an alternating sequence of male connector pins and sockets in each row such that each interstitial space between the sockets is occupied by a pin and each interstitial space between the male connector pins is occupied by a socket. The alignment plate further includes an array of socket holes corresponding to and aligned with the array of sockets in the support member. When the compression mechanisms are in the compressed position, each socket hole in the alignment plate engages with its corresponding socket in the array of sockets in the support member.

In another aspect of the invention, a connector alignment assembly, comprises a first support member having a surface from which a first array of male connector pins extend outwardly, each male connector pin having a base region proximate the surface of the first support member and a tip region proximate the end of each male connector pins. There are a first plurality of guide posts extending from the surface of the first support member in the direction of the first array of male connector pins and a first plurality of compression mechanisms, one associated with each of said first plurality of guide posts. The first plurality of compression mechanisms are each adapted to transition from the uncompressed position to a compressed position. There is a first alignment plate having a first plurality of guide holes which engage with the first plurality of guide posts and the associated first plurality of compression mechanisms to position the first alignment plate in a spaced relationship from the surface of the first support member. The first alignment plate further having a first array of male connector pin holes each of which engages with a corresponding male connector pin from the first array of male connector pins. When the first plurality of compression mechanisms are in the uncompressed position, each male connector pin hole of the first array of male connector pin holes in the first alignment plate engages with the tip region of a corresponding male connector pin of the first array of male connector pins.

There is a second support member, positioned above and spaced from said first support member, having a surface from which a second array of male connector pins extend outwardly in the direction of the first support member. Each male connector pin having a base region proximate the surface of the second support member and a tip region proximate the end of each male connector pin. There is a second plurality of guide posts extending from the surface of the second support member in the direction of the plurality of male connector pins and a second plurality of compression mechanisms, one associated with each of said second plurality of guide posts. The second plurality of compression mechanisms are each adapted to transition from the uncompressed position to a compressed position. There is a second alignment plate having a second plurality of guide holes which engage with the second plurality of guide posts and the associated second plurality of compression mechanisms to position the second alignment plate in a spaced relationship from the surface of the second support member. The second alignment plate further having a second array of male connector pin holes each of which engages with a corresponding male connector pin from the second array of male connector pins. When the second plurality of compression mechanisms are in the uncompressed position, each male connector pin hole of the second array of male connector pin holes in the second alignment plate engages with the tip region of a corresponding male connector pin of the second array of male connector pins.

In embodiments of this aspect of the invention, when the first and second pluralities of compression mechanisms are in the compressed positions, each male connector pin hole of the first array of male connector pin holes in the first alignment plate engages with the base region of its corresponding male connector pin of the first array of male connector pins and each male connector pin hole of the second array of male connector pin holes in the second alignment plate engages with the base region of its corresponding male connector pin of the second array of male connector pins. There are four guide posts positioned about the perimeter of the first support member and the first plurality of compression mechanisms are springs, each disposed about a guide post and wherein there are four guide posts positioned about the perimeter of the second support member and the second plurality of compression mechanisms are springs, each disposed about a guide post.

The first support member further includes a first array of sockets disposed on the surface of the first support member and wherein the second support member further includes a second array of sockets disposed on the surface of the second support member. The first array of male connector pins is arranged in a first plurality of rows on the surface of the first support member and the first array of sockets is arranged in said first plurality of rows with an alternating sequence of male connector pins and sockets in each row such that each interstitial space between the sockets is occupied by a pin and each interstitial space between the male connector pins is occupied by a socket. The second array of male connector pins is arranged in a second plurality of rows on the surface of the second support member and the second array of sockets is arranged in said second plurality of rows with an alternating sequence of male connector pins and sockets in each row such that each interstitial space between the sockets is occupied by a pin and each interstitial space between the male connector pins is occupied by a socket.

The first alignment plate further includes a first array of socket holes corresponding to and aligned with the first array of sockets in the first support member. When the first plurality of compression mechanisms are in the compressed position, each socket hole in the first alignment plate engages with its corresponding socket in the first array of sockets in the first support member. The second alignment plate further includes a second array of socket holes corresponding to and aligned with the second array of sockets in the second support member. When the second plurality of compression mechanisms are in the compressed position, each socket hole in the second alignment plate engages with its corresponding socket in the second array of sockets in the second support member. The first array of male connector pin holes of the first alignment plate are aligned with the second array of socket holes of the second alignment plate and wherein the first array of socket holes of the first alignment plate are aligned with the second array of male connector pin holes of the second alignment plate.

The first array of male connector pins from the first support member pass through the second array of socket holes in the second alignment plate and are engaged with the second array of sockets of the second support member and the second array of male connector pins from the second support member pass through the first array of socket holes in the first alignment plate and are engaged with the first array of sockets of the first support member. The four guide posts of the first support member each pass through a corresponding guide hole in the second plurality of guide holes in the second alignment plate and are each engaged with a corresponding guide hole in the second support member. The four guide posts of the second support member each pass through a corresponding guide hole in the first plurality of guide holes in the first alignment plate and are each engaged with a corresponding guide hole in the first support member.

Among other advantages, in the uncompressed state, each connector pin hole of the array of male connector pin holes of the alignment plate receives and constrains the tip region of a corresponding male connector pin to protect the pins from being bent or broken during handling, transport, and mating. That is, in an ideal arrangement, in which all of male connector pins are straight, the male connector pins would not contact the alignment plate including the inner surfaces of male connector pin holes. If, on the other hand, any one of male connector pins is slightly bent or misaligned, those pins are likely to contact the inner surface of corresponding male connector pin holes, which will serve to align and protect those male connector pins.

Other features and advantages of the invention are apparent from the following description, and from the claims.

DETAILED DESCRIPTION

Figure 1:
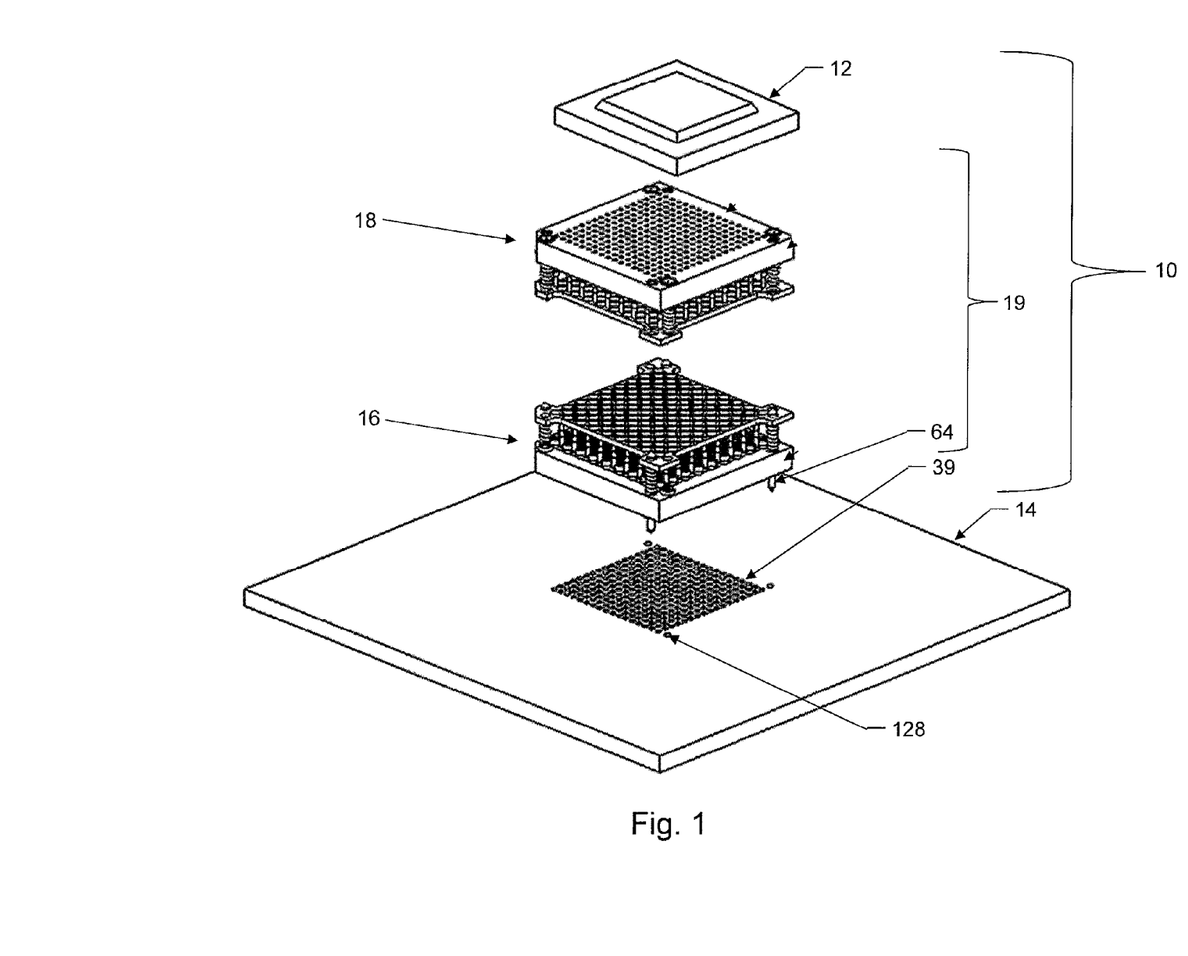
FIG. 1 is an exploded, isometric view of an intercoupling component including two hermaphroditic terminal assemblies, and an IC package.
Figure 2:
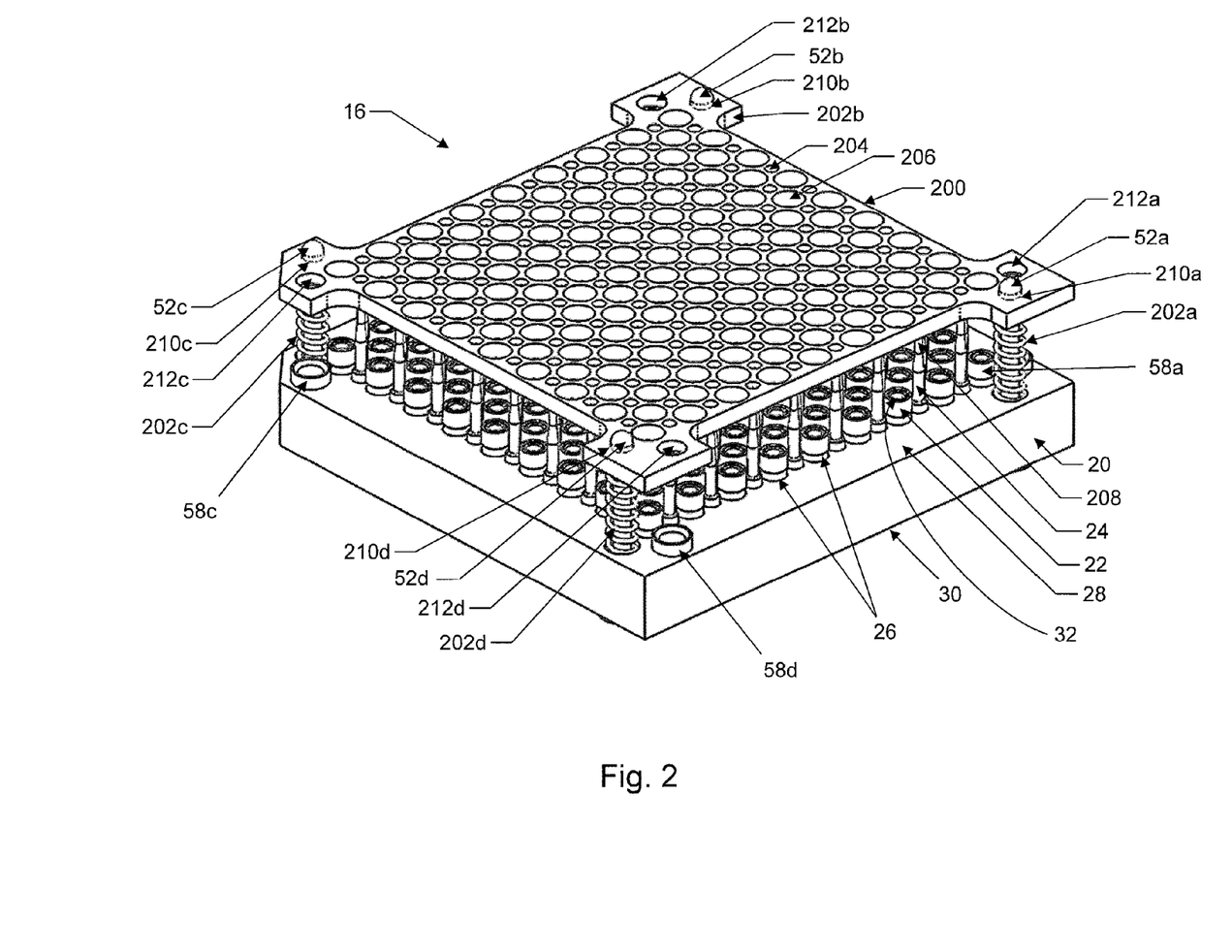
FIG. 2 is a perspective view of the hermaphroditic terminal assembly of FIG. 1.

Referring to FIGS. 1 and 2, a hermaphroditic socket/adapter assembly 10 for electrically connecting an IC package 12 to a PCB 14 includes a first hermaphroditic terminal assembly 16 and a second hermaphroditic terminal assembly 18 that together comprise an inter-coupling component 19.

First hermaphroditic terminal assembly 16 includes an insulating support member 20 formed of an insulating material such as thermoplastic material for supporting female sockets 22 and male pins 24. Insulating support member 20 includes a first array of apertures 26, extending from the upper surface 28 of insulating support member 20 to the bottom surface 30 of insulating support member 20. Each female socket 22 is received within one aperture 26 of the first array of apertures of the insulating support member 20. Each female socket 22 has a first end 32 configured to receive a corresponding male pin 24' (FIG. 5) of the second hermaphroditic terminal assembly 18 and a second end 36 attached to a solder ball 38 that establishes an electrical connection with the electrical contact 39 on PCB 14. The female sockets 22 received within the first array of apertures 26 of the insulating support member 20 are arranged such that interstitial spaces 40 (FIG. 5) exist between the female sockets 22.

Insulating support member 20 also includes a second array of apertures 42, extending from the upper surface 28 of insulating support member 20 to the bottom surface 30 of insulating support member 20. Each male pin 24 is received within one aperture 42 of the second array of apertures of the insulating support member 20. Each male pin has a first end 44 configured to be received within a corresponding female socket 46 of the second hermaphroditic terminal assembly 18 and a second end 48 attached to a solder ball 38 that establishes an electrical connection with electrical contact 39 on PCB 14.

In some applications, it may be desirable for at least one male pin 49 to be of a different height than every other male pin 24 where the height of a pin is defined as the length from the first end of the pin 44 to the second end of the pin 48. Varying the height of the pins serves to decrease the force required to insert the first hermaphroditic terminal assembly 16 into a corresponding hermaphroditic terminal assembly. Varying the height of the pins also serves to decrease the force required to extract the first hermaphroditic terminal assembly 16 from a corresponding hermaphroditic terminal assembly into which it has been inserted. The male pins 24 received within the second array of apertures 42 of the insulating support member 20 are arranged such that interstitial spaces exist between the male pins 24. Collectively, the female sockets 22 and the male pins 24 are arranged in a pattern such that the interstitial spaces 40 (FIG. 5) between the female sockets 22 are occupied by male pins 24, and the interstitial spaces between the male pins 24 are occupied by female sockets 22. It is appreciated that the female sockets 22 and the male pins 24 could be arranged in different patterns.

Among other advantages, intercoupling components having the structure discussed above provides all of the advantages associated with traditional socket/adapter technology (e.g., non-permanent connections) while providing a substantial increase in the density of electrical connections between electrical devices or substrates (e.g., printed circuit boards) having electrical connections.

First hermaphroditic terminal assembly 16 further includes four alignment guide posts 52a-52d one located at each of the corners of and disposed through the upper surface 28 of the insulating support member 20. There are also four alignment guide holes 58a-d proximate to guide posts 52a-d and located in the corners of the first hermaphroditic terminal assembly 16.

An alignment plate 200 formed of an insulating material such as thermoplastic material or other high temperature insulator is positioned in spaced relation from the surface 28 of insulated support member 20. As will be described in greater detail below, alignment plate 200 is supported and positioned by guide posts 52a-52d via guide holes 210a-d, each of which is positioned at the corners of alignment plate 200. Springs 202a-202d, which serve as compression mechanisms, are disposed about guide posts 52a-52d and when in the uncompressed position cause alignment plate 200 to be spaced from surface 28 of insulated support member 20. It should be noted that other types of compression mechanisms such as high temperature foams, machined springs, or stacked wave springs can be substituted for springs 202a-202d.

Alignment plate 200 includes an array of male connector pin holes 204 and an array of socket holes 206. Male connector pin holes 204 and socket holes 206 are positioned such that respective male connector pins 24 and female sockets 22 are ideally received through the center of each hole when the compression mechanisms 202a-202d are in the compressed position. Male connector pin holes 204 are sized such that male connector pins 24 are received through each hole without contact but at the same time constrain tip regions 208 of the corresponding male connector pins 24 when the compression mechanisms are in the uncompressed position. Thus, in the uncompressed state, each connector pin hole of the array of male connector pin holes 204 of alignment plate 200 receives and constrains the tip region 208 of a corresponding male connector pin 24 to protect the pins from being bent or broken during handling, transport, and mating. That is, in an ideal arrangement, in which all of male connector pins 24 are straight, the male connector pins would not contact alignment plate 200 including the inner surfaces of male connector pin holes 204. If, on the other hand, any one of male connector pins 24 is slightly bent or misaligned, those pins are likely to contact the inner surface of corresponding male connector pin holes 204, which will serve to align and protect those male connector pins.

Alignment plate 200 also includes guide holes 210a-d, which align with and engage guide posts 52a-52d, respectively, to allow for proper alignment of the array of male connector pins with the array of male connector pin holes 204 as well as alignment and engagement of the array of sockets with the array of socket holes 206. Also included are guide holes 212a-d, which are adapted to engage with the guide posts of the second hermaphroditic terminal assembly 18, as described below.

Figure 3:
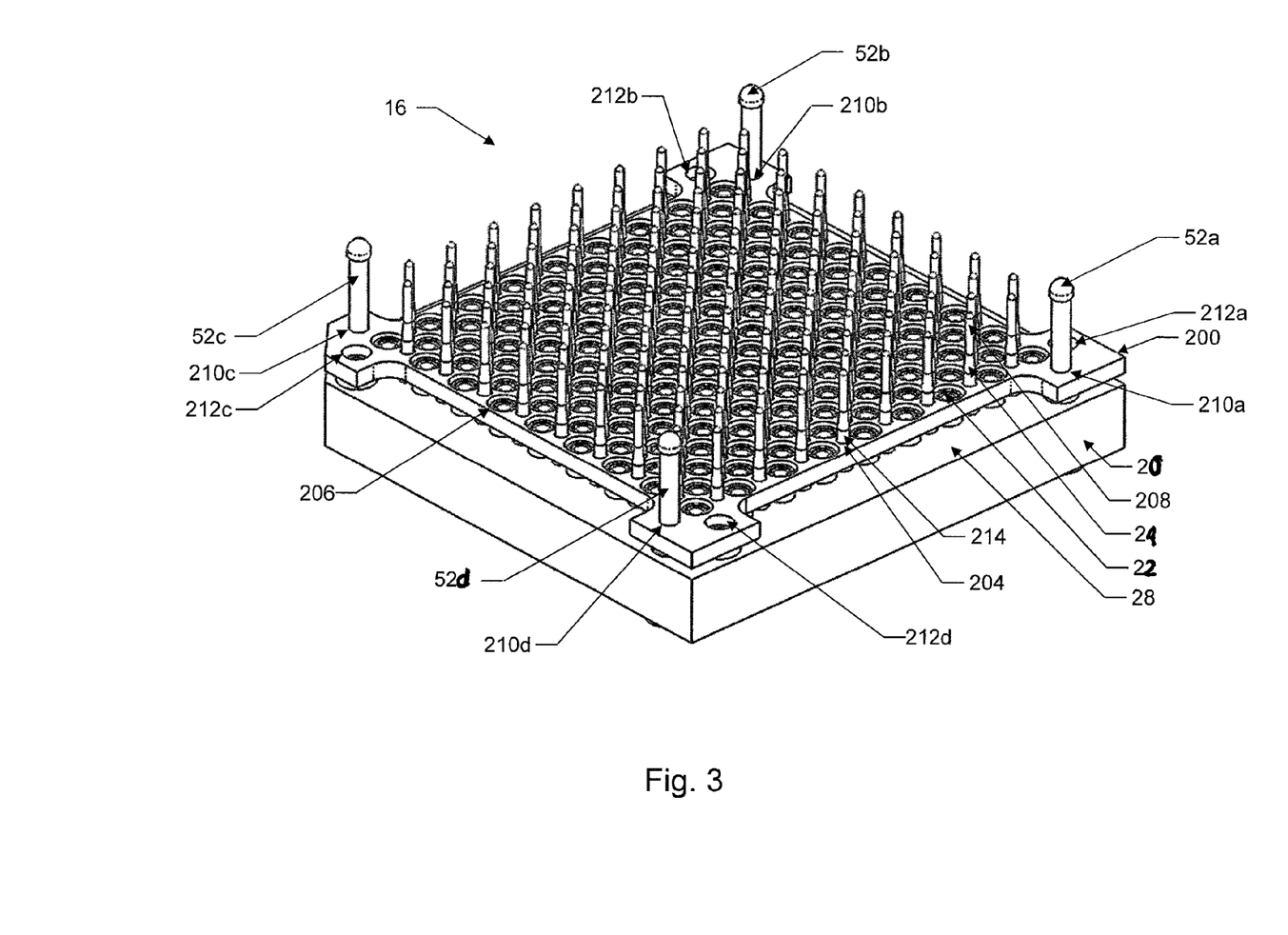
FIG. 3 is another perspective view of the hermaphroditic terminal assembly of FIG. 1.

As shown in FIG. 3, when the compression mechanisms 202a-d (not visible) are compressed, alignment plate 200 is moved toward surface 28 of insulated support member 20 and positioned in close proximity thereto. In this position, the array of male connector pin holes 204 of alignment plate 200 engage with the base regions 214 of the array of male connector pins 24. In addition, the array of socket holes 206 of alignment plate 200 engage with the array of sockets 22.

The diameter of the male connector pins holes 204 are generally large enough to accommodate the base regions 214 of the connector pins 24, which are larger than the tip regions 208 of the connector pins 24. The diameter of tip region 208 and base region 214 of male connector pins 24 is typically 12 mils and 8 mils, respectively. With these male connector pin dimensions, male connector holes 204 should have a diameter of approximately 20 mils. The socket holes 206 are sized slightly larger than the female sockets 22 so that in the compressed position holes 206 receive and engage with female sockets 22. The diameters of sockets 22 and socket holes 206 are typically 32 mils and 37 mils, respectively.

In the particular embodiments described, alignment plate 200 is formed of an insulating material (e.g., thermoplastic polyester) and has a typical thickness of about 20 mils. In certain applications in which the overall device or the number of connections is different, the thickness of the alignment plate may be varied appropriately.

Figure 4:
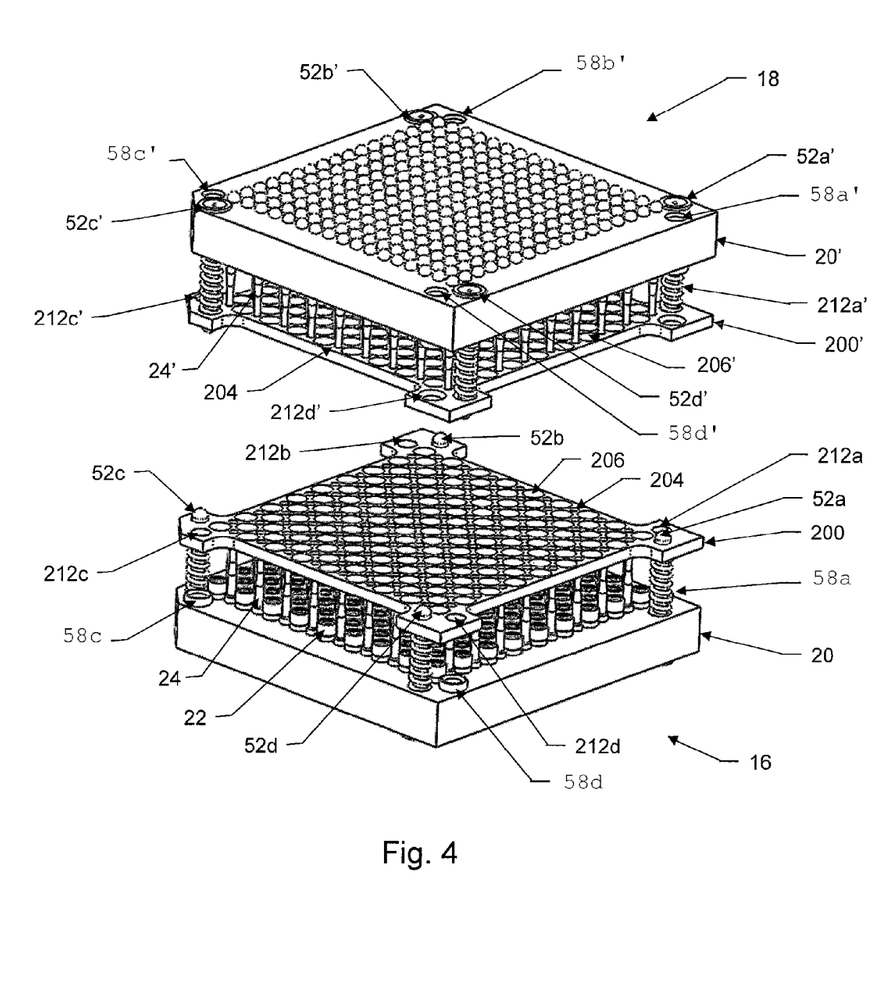
FIG. 4 is a perspective view of two hermaphroditic terminal assemblies aligned for mating.

Referring to FIG. 4, first hermaphroditic terminal assembly 16 is positioned below second hermaphroditic terminal assembly 18, prior to being mated. Guide posts 52a'-52d' of the second hermaphroditic terminal assembly 18 are aligned with corresponding guide holes 212a-212d in alignment plate 200 of the first hermaphroditic terminal assembly 16. Similarly, guide posts 52a-52d of the first hermaphroditic terminal assembly 16 are aligned with corresponding guide holes 212a'-212d' in alignment plate 200' of the second hermaphroditic terminal assembly 18.

Once aligned, the hermaphroditic terminal assemblies can be brought together such that the springs on the guide posts 52a-52d and 52a'-52d' are compressed as the guide posts to pass through guide holes 212a-212d and 212a'-212d', respectively, in alignment plates 200/200'. Eventually, when the terminal assemblies are fully brought together, the guide posts 52a-52d and 52a'-52d' of the terminal assembly 16 and 18 are then mated to corresponding guide holes 58a-58d/58a'-58d' of insulated support members 20/20'. The terminal assemblies are then retained in this position.

As the first hermaphroditic terminal assembly 16 and a second hermaphroditic terminal assembly 18 are mated, the male connector pins 24/24' of each hermaphroditic terminal assembly pass through corresponding male connector pin holes 204/204' in the alignment plates 200/200' and are eventually inserted within and mated to corresponding female sockets 22/22' in support members 20/20'. The female sockets 22/22' are received within corresponding female socket holes 206/206' in the alignment plates 200/200'. The hermaphroditic terminal assemblies are retained in the mated position via the frictional forces between the male connector pins and the female sockets. In certain embodiments a heat sink can be incorporated into the assembly.

Figure 5:
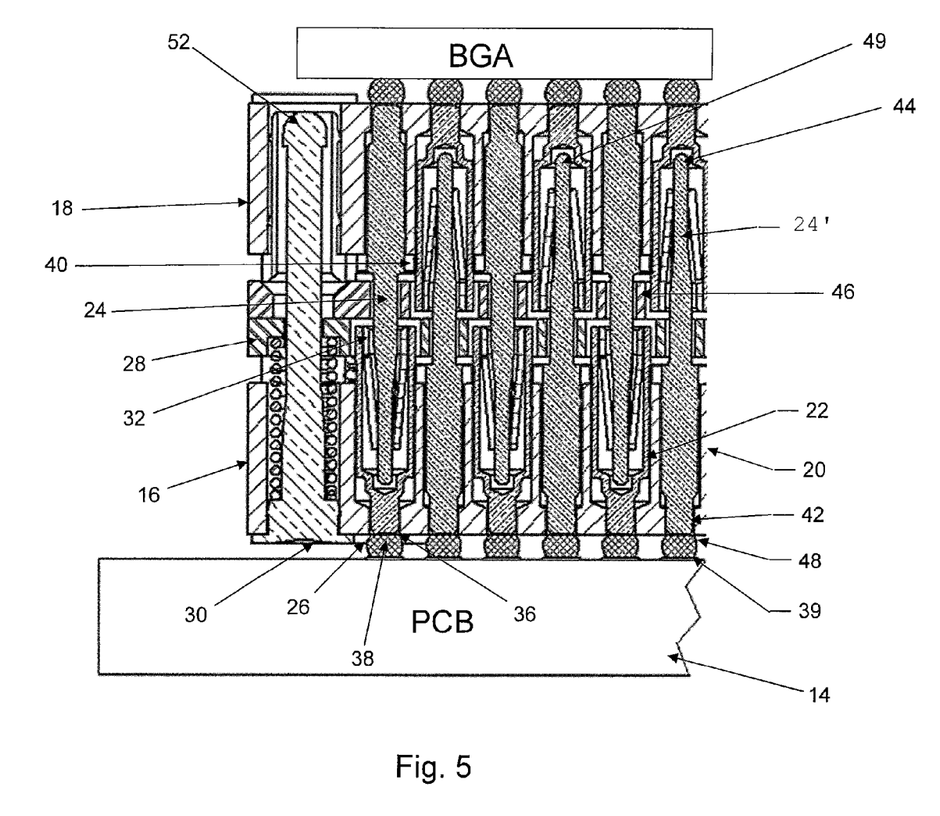
FIG. 5 is a cross-sectional side view of a portion of the intercoupling component of FIG. 1 in the mated position.

Referring to FIG. 5, the electrical connection between IC package 12 and PCB 14 is formed by inserting each male pin 24' of the second hermaphroditic terminal assembly 18 into a corresponding female socket 22 of the first hermaphroditic terminal assembly 16 and inserting each male pin 24 of the first hermaphroditic terminal assembly 16 into a corresponding female socket 22' of the second hermaphroditic terminal assembly 18. Second hermaphroditic terminal assembly 18 includes an insulating support member 20' for supporting female sockets 22' and male pins 24'. Insulating support member 20' includes a first array of apertures 216', extending from the upper surface 28' of insulating support member 20' to the bottom surface 30' of insulating support member 20'. Each female socket 22' is received within one aperture 216' of the first array of apertures of the insulating support member 20'. Each female socket 22' has a first end 300' configured to receive a corresponding male pin 24 of the first hermaphroditic terminal assembly 16 and a second end 302' configured to contact a solder ball 38' on IC package 12. The female sockets 22' received within the first array of apertures 216' of the insulating support member 20' are arranged such that interstitial spaces exist between the female sockets 22'.

Insulating support member 20' also includes a second array of apertures 306', extending from the upper surface 28' of insulating support member 20' to the bottom surface 30' of insulating support member 20'. Each male pin 24' is received within one aperture 306' of the second array of apertures of the insulating support member 20'. Each male pin has a first end 308' configured to be received within a corresponding female socket 22 of the first hermaphroditic terminal assembly 16 and a second end 310' configured to contact a corresponding solder ball 38' on IC package 12. In some applications, it may be desirable for at least one male pin (not shown) to be of a different height than every other male pin 24', where the height of a pin is defined as the length from the first end of the pin 308' to the second end of the pin 310'.

As discussed above, varying the height of the pins serves to decrease the force required to insert the second hermaphroditic terminal assembly 18 into a corresponding hermaphroditic terminal assembly. It also serves to decrease the force required to extract the second hermaphroditic terminal assembly 18 from a corresponding hermaphroditic terminal assembly into which it has been inserted. The male pins 24' received within the second array of apertures 306' of the insulating support member 20' are arranged such that interstitial spaces exist between the male pins 24'. Collectively, the female sockets 22' and the male pins 24' are arranged in a pattern such that the interstitial spaces between the female sockets 22' are occupied by male pins 24', and the interstitial spaces between the male pins 24' are occupied by female sockets 22'. It is appreciated that the female sockets 22' and the male pins 24' could be arranged in different patterns.

The intercoupling component 19 is used to electrically connect IC package 12 to PCB 14. IC package 12 is secured to the lower surface 30' of insulating support member 20' of the second hermaphroditic terminal assembly 18 such that the solder balls 38' on IC package 12 are brought into contact with the second ends 302' of the female sockets 22' of the second hermaphroditic terminal assembly 18 and the second ends 310' of the male pins 24' of the second hermaphroditic terminal assembly 18. The alignment guide posts 52a'-52d' disposed through the lower surface 30' of insulating support member 20' of the second terminal assembly 18 can be used to properly align the solder balls 38' on the IC package 12 with the second ends 302' of the female sockets 22' of the second hermaphroditic terminal assembly 18 and the second ends 310' of the male pins 24' of the second hermaphroditic terminal assembly 18.

It is appreciated that other alignment elements could be used to facilitate proper alignment of the solder balls 38' on IC package 12 with the second ends 302' of the female sockets 22' of the second hermaphroditic terminal assembly 18 and the second ends of the male pins 24' of the second hermaphroditic terminal assembly 18. It is also appreciated that alignment elements are not required to properly align the electrical contacts 38' on IC package 12 with the second ends 302' of the female sockets 22' of the second hermaphroditic terminal assembly 18 and the second ends of the male pins 34 of the second hermaphroditic terminal assembly 18.

The second hermaphroditic terminal assembly 18 is coupled to the first hermaphroditic terminal assembly 16 by inserting each male pin 24' of the second terminal assembly 18 into a corresponding female socket 22 of the first hermaphroditic terminal assembly 16 and inserting each male pin 24 of the first hermaphroditic terminal assembly 16 into a corresponding female socket 22' of the second hermaphroditic terminal assembly 18. When the second hermaphroditic terminal assembly 18 is coupled to the first hermaphroditic terminal assembly 16, it is said to be mated with the first hermaphroditic terminal assembly 16.

It is appreciated that other alignment elements could be used to facilitate proper alignment of the male pins 24' of the second hermaphroditic terminal assembly 18 with the corresponding female sockets 22 of the first hermaphroditic terminal assembly 16 and the male pins 24 of the first hermaphroditic terminal assembly 16 with the corresponding female sockets 22' of the second hermaphroditic terminal assembly 18. It is also appreciated that alignment elements are not required to properly align the male pins 24' of the second hermaphroditic terminal assembly 18 with the corresponding female sockets 22 of the first hermaphroditic terminal assembly 16 and the male pins 24 of the first hermaphroditic terminal assembly 16 with the corresponding female sockets 22' of the second hermaphroditic terminal assembly 18. In some applications, it may be advantageous for the alignment guide posts 52a-52d disposed through the upper surface 28' of insulating support member 20' of the second hermaphroditic terminal assembly 18 and the alignment guide posts 52a'-52d' disposed through the upper surface 28 of insulating support member 20 of the first hermaphroditic terminal assembly 16 to serve as power, voltage, or ground connections.

First hermaphroditic terminal assembly 16 is similar to second hermaphroditic terminal assembly 18. In an embodiment where they are identical, in order to connect first hermaphroditic terminal assembly 16 to second hermaphroditic terminal assembly 18, second hermaphroditic terminal assembly 18 is rotated 90 degrees so that the male pins 24' of the second hermaphroditic terminal assembly 18 are aligned with corresponding female sockets 22 of the first hermaphroditic terminal assembly 16 and the male pins 24 of the first hermaphroditic terminal assembly 16 are aligned with corresponding female sockets 22' of the second hermaphroditic terminal assembly 18. It is appreciated that the first hermaphroditic terminal assembly 16 need not be identical to the second hermaphroditic terminal assembly 18.

First hermaphroditic terminal assembly 16 is secured to PCB 14 such that the solder balls 38 attached to second ends 36 of the female sockets 22 of the first hermaphroditic terminal assembly 16 and the solder balls 38 attached to second ends 316 of the male pins 24 of the first hermaphroditic terminal assembly 16 are in contact with the electrical contacts 39 on PCB 14. As shown in FIG. 1, the alignment guide posts 52a-52d disposed through the lower surface 30 of the insulating support member 20 of the first hermaphroditic terminal assembly 16 are inserted into alignment guide holes 128 in PCB 14. It is appreciated that other alignment elements could be used to facilitate proper alignment of the solder balls 38 attached to second ends 36 of the female sockets 22 of the first hermaphroditic terminal assembly 16 and the solder balls 38 attached to second ends 316 of the male pins 24 of the first hermaphroditic terminal assembly 16 with the electrical contacts 39 on PCB 14. It is also appreciated that alignment elements are not required.

When IC package 12 is secured to the lower surface 30' of insulating support member 20' of the second hermaphroditic terminal assembly 18 such that the solder balls 38' on IC package 12 are in contact with the second ends 302' of the female sockets 22' of the second hermaphroditic terminal assembly 18 and the second ends 310' of the male pins 24' of the second hermaphroditic terminal assembly 18; second hermaphroditic terminal assembly 18 is coupled to the first hermaphroditic terminal assembly 16 such that each male pin 24' of the second hermaphroditic terminal assembly 18 is received within a corresponding female socket 22 of the first hermaphroditic terminal assembly 16 and each male pin 24 of the first hermaphroditic terminal assembly 16 is received within a corresponding female socket 22' of the second hermaphroditic terminal assembly 18; and first hermaphroditic terminal assembly 16 is secured to PCB 14 such that that the solder balls 38 attached to second ends 36 of the female sockets 22 of the first hermaphroditic terminal assembly 16 and the solder balls 38 attached to second ends 316 of the male pins 24 of the first terminal assembly 16 are in contact with the electrical contacts 39 on PCB 14, the IC package 12 being electrically connected to PCB 14.

A number of embodiments of the invention have been described. Nevertheless, it will be understood that various modifications may be made without departing from the spirit and scope of the invention. For example, hermaphroditic terminal assemblies can be used to electrically connect many different types of electrical devices. Accordingly, other embodiments are within the scope of the following claims.

What is claimed is:

1. A connector alignment assembly, comprising:
   a support member having a surface from which an array of male connector surface of the support member and a tip region proximate the end of each male connector pin;
   a plurality of guide posts extending from the surface in the direction of the array of male connector pins;
   a plurality of compression mechanisms, one associated with each of said plurality of guide posts, wherein the plurality of compression mechanisms are adapted to transition from the uncompressed position to a compressed position;
   an alignment plate having a plurality of guide holes which engage with the plurality of guide posts and the associated compression mechanisms to position the alignment plate in a spaced relationship from the surface of the support member; the alignment plate further having an array of male connector pin holes each of which engages with a corresponding male connector pin from the array of male connector pins; and
   wherein, when the compression mechanisms are in the uncompressed position, each male connector pin hole of the array of male connector pin holes in the alignment plate engages with the tip region of a corresponding male connector pin of the array of male connector pins thereby protecting the male connector pins from damage.

2. The connector alignment assembly of claim 1, wherein, when the compression mechanisms are in the compressed position, each male connector pin hole of the array of male connector pin holes in the alignment plate engages with the base region of its corresponding male connector pin of the array of male connector pins.

3. The connector alignment assembly of claim 1, wherein each of the plurality of compression mechanisms is disposed about a corresponding one of the plurality of guide posts.

4. The connector alignment assembly of claim 1, wherein the support member further includes an array of sockets disposed on the surface.

5. The connector alignment assembly of claim 1, wherein the array of male connector pins is arranged in a plurality of rows on the surface of the support member.

6. The connector alignment assembly of claim 4, wherein the array of male connector pins is arranged in a plurality of rows on the surface of the support member and the array of sockets is arranged in said plurality of rows with an alternating sequence of male connector pins and sockets in each row such that each interstitial space between the sockets is occupied by a pin and each interstitial space between the male connector pins is occupied by a socket.

7. The connector alignment assembly of claim 6, wherein the alignment plate further includes an array of socket holes corresponding to and aligned with the array of sockets in the support member; wherein, when the compression mechanisms are in the compressed position, each socket hole in the alignment plate engages with its corresponding socket in the array of sockets in the support member.

8. The connector alignment assembly of claim 1, wherein there are four guide posts positioned about the perimeter of the support member.

9. The connector alignment assembly of claim 1, wherein each of the plurality of compression mechanisms-are springs.

10. The connector alignment assembly of claim 2, wherein there are four guide posts positioned about the perimeter of the support member.

11. The connector alignment assembly of claim 2, wherein each of the plurality of compression mechanisms are springs.

12. A connector alignment assembly, comprising:
a first support member having a surface from which a first array of male connector pins extend outwardly, each male connector pin having a base region proximate the surface of the first support member and a tip region proximate the end of each male connector pin;
a first plurality of guide posts extending from the surface of the first support member in the direction of the first array of male connector pins;
a first plurality of compression mechanisms, one associated with each of said first plurality of guide posts, wherein the first plurality of compression mechanisms are adapted to transition from the uncompressed position to a compressed position;
a first alignment plate having a first plurality of guide holes which engage with the first plurality of guide posts and the associated first plurality of compression mechanisms to position the first alignment plate in a spaced relationship from the surface of the first support member; the first alignment plate further having a first array of male connector pin holes each of which engages with a corresponding male connector pin from the first array of male connector pins;
wherein, when the first plurality of compression mechanisms are in the uncompressed position, each male connector pin hole of the first array of male connector pin holes in the first alignment plate engages with the tip region of a corresponding male connector pin of the first array of male connector pins;
a second support member, positioned above and spaced from said first support member, having a surface from which a second array of male connector pins extend outwardly in the direction of the first support member, each male connector pin having a base region proximate the surface of the second support member and a tip region proximate the end of each male connector pin;
a second plurality of guide posts extending from the surface of the second support member in the direction of the plurality of male connector pins;
a second plurality of compression mechanisms, one associated with each of said second plurality of guide posts, wherein the second plurality of compression mechanisms are adapted to transition from the uncompressed position to a compressed position;
a second alignment plate having a second plurality of guide holes which engage with the second plurality of guide posts and the associated second plurality of compression mechanisms to position the second alignment plate in a spaced relationship from the surface of the second support member; the second alignment plate further having a second array of male connector pin holes each of which engages with a corresponding male connector pin from the second array of male connector pins;
wherein, when the second plurality of compression mechanisms are in the uncompressed position, each male connector pin hole of the second array of male connector pin holes in the second alignment plate engages with the tip region of a. corresponding male connector pin of the second array of male connector pins.

13. The connector alignment assembly of claim 12, wherein, when the first and second pluralities of compression mechanisms are in the compressed positions, each male connector pin hole of the first array of male connector pin holes in the first alignment plate engages with the base region of its corresponding male connector pin of the first array of male connector pins and each male connector pin hole of the second array of male connector pin holes in the second alignment plate engages with the base region of its corresponding male connector pin of the second array of male connector pins.

14. The connector alignment assembly of claim 13, wherein there are four guide posts positioned about the perimeter of the first support member and the first plurality of compression mechanisms are springs, each disposed about a guide post and wherein there are four guide posts positioned about the perimeter of the second support member and the second plurality of compression mechanisms are springs, each disposed about a guide post.

15. The connector alignment assembly of claim 14, wherein the first support member further includes a first array of sockets disposed on the surface of the first support member and wherein the second support member further includes a second array of sockets disposed on the surface of the second support member.

16. The connector alignment assembly of claim 15, wherein the first array of male connector pins is arranged in a first plurality of rows on the surface of the first support member and the first array of sockets is arranged in said first plurality of rows with an alternating sequence of male connector pins and sockets in each row such that each interstitial space between the sockets is occupied by a pin and each interstitial space between the male connector pins is occupied by a socket; and wherein the second array of male connector pins is arranged in a second plurality of rows on the surface of the second support member and the second array of sockets is arranged in said second plurality of rows with an alternating sequence of male connector pins and sockets in each row such that each interstitial space between the sockets is occupied by a pin and each interstitial space between the male connector pins is occupied by a socket.

17. The connector alignment assembly of claim 16, wherein the first alignment plate further includes a first array of socket holes corresponding to and aligned with the first array of sockets in the first support member; wherein, when the first plurality of compression mechanisms are in the compressed position, each socket hole in the first alignment plate engages with its corresponding socket in the first array of sockets in the first support member; and wherein the second alignment plate further includes a second array of socket holes corresponding to and aligned with the second array of sockets in the second support member; wherein, when the second plurality of compression mechanisms are in the compressed position, each socket hole in the second alignment plate engages with its corresponding socket in the second array of sockets in the second support member.

18. The connector alignment assembly of claim 17, wherein the first array of male connector pin holes of the first alignment plate are aligned with the second array of socket holes of the second alignment plate and wherein the first array of socket holes of the first alignment plate are aligned with the second array of male connector pin holes of the second alignment plate.

19. The connector alignment assembly of claim 18, wherein the first array of male connector pins from the first support member pass through the second array of socket holes in the second alignment plate and are engaged with the second array of sockets of the second support member; and wherein the second array of male connector pins from the second support member pass through the first array of socket holes in the first alignment plate and are engaged with the first array of sockets of the first support member.

20. The connector alignment assembly of claim 19, wherein the four guide posts of the first support member each pass through a corresponding guide hole in the second plurality of guide holes in the second alignment plate and are each engaged with a corresponding guide hole in the second support member; and wherein the four guide posts of the second support member each pass through a corresponding guide hole in the first plurality of guide holes in the first alignment plate and are each engaged with a corresponding guide hole in the first support member.

* * * * *